United States Patent
Chen et al.

(10) Patent No.: US 9,673,140 B2
(45) Date of Patent: Jun. 6, 2017

(54) PACKAGE STRUCTURE HAVING A LAMINATED RELEASE LAYER AND METHOD FOR FABRICATING THE SAME

(71) Applicant: Siliconware Precision Industries Co., Ltd., Taichung (TW)

(72) Inventors: Chia-Cheng Chen, Taichung (TW);
Ming-Chen Sun, Taichung (TW);
Tzu-Chieh Shen, Taichung (TW);
Shih-Chao Chiu, Taichung (TW);
Wei-Chung Hsiao, Taichung (TW);
Yu-Cheng Pai, Taichung (TW);
Don-Son Jiang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/620,328

(22) Filed: Feb. 12, 2015

(65) Prior Publication Data
US 2015/0287671 A1    Oct. 8, 2015

(30) Foreign Application Priority Data
Apr. 8, 2014  (TW) .............................. 103112807 A

(51) Int. Cl.
*H01L 23/498*     (2006.01)
*H01L 21/48*      (2006.01)
(Continued)

(52) U.S. Cl.
CPC .... *H01L 23/49811* (2013.01); *H01L 21/4853* (2013.01); *H01L 23/5389* (2013.01);
(Continued)

(58) Field of Classification Search
CPC . H01L 23/49811; H01L 23/492; H01L 23/02; H01L 23/04; H01L 23/043;
(Continued)

(56) References Cited

U.S. PATENT DOCUMENTS

| 2005/0017347 | A1* | 1/2005 | Morimoto | ............... | H05K 1/186 |
| | | | | | 257/703 |
| 2007/0200204 | A1* | 8/2007 | Suzuki | ................... | H01L 23/552 |
| | | | | | 257/664 |

(Continued)

*Primary Examiner* — Charles Garber
*Assistant Examiner* — Brigitte Paterson
(74) *Attorney, Agent, or Firm* — Mintz Levin Cohn Ferris Glovsky and Popeo, P.C.; Peter F. Corless; Steven M. Jensen

(57) ABSTRACT

A method for fabricating a package structure is provided, which includes the steps of: providing a carrier having a plurality of bonding pads; laminating a laminate on the carrier, wherein the laminate has a built-up portion and a release portion smaller in size than the built-up portion, the release portion covering the bonding pads and the built-up portion being laminated on the release portion and the carrier; forming a plurality of conductive posts in the built-up portion; and removing the release portion and the built-up portion on the release portion such that a cavity is formed in the laminate to expose the bonding pads, the conductive posts being positioned around a periphery of the cavity. Therefore, the present invention has simplified processes.

9 Claims, 3 Drawing Sheets

(51) Int. Cl.
*H01L 23/538* (2006.01)
*H01L 23/00* (2006.01)
*H01L 25/10* (2006.01)
*H01L 25/16* (2006.01)

(52) U.S. Cl.
CPC .............. *H01L 24/13* (2013.01); *H01L 24/16* (2013.01); *H01L 24/73* (2013.01); *H01L 24/92* (2013.01); *H01L 25/105* (2013.01); *H01L 25/16* (2013.01); *H01L 2224/131* (2013.01); *H01L 2224/16227* (2013.01); *H01L 2224/16235* (2013.01); *H01L 2224/16237* (2013.01); *H01L 2224/73204* (2013.01); *H01L 2224/92125* (2013.01); *H01L 2225/1023* (2013.01); *H01L 2225/1058* (2013.01); *H01L 2225/1076* (2013.01); *H01L 2924/1579* (2013.01); *H01L 2924/15156* (2013.01); *H01L 2924/15159* (2013.01); *H01L 2924/15311* (2013.01); *H01L 2924/19103* (2013.01); *H01L 2924/37001* (2013.01)

(58) Field of Classification Search
CPC ... H01L 23/045; H01L 23/049; H01L 23/051; H01L 23/10; H01L 23/06; H01L 23/08; H01L 23/053; H01L 23/057; H01L 23/12; H01L 23/15; H01L 23/49822; H01L 23/49827

See application file for complete search history.

(56) References Cited

U.S. PATENT DOCUMENTS

| | | | |
|---|---|---|---|
| 2008/0277148 A1* | 11/2008 | Asai | H05K 3/387 174/255 |
| 2012/0235303 A1* | 9/2012 | Liu | H01L 23/562 257/773 |
| 2013/0032390 A1* | 2/2013 | Hu | H01L 23/147 174/266 |

* cited by examiner

PACKAGE STRUCTURE HAVING A LAMINATED RELEASE LAYER AND METHOD FOR FABRICATING THE SAME

CROSS-REFERENCES TO RELATED APPLICATIONS

This application claims under 35 U.S.C. §119(a) the benefit of Taiwanese Application No. 103112807, filed Apr. 8, 2014, the entire contents of which are incorporated herein by reference.

BACKGROUND OF THE INVENTION

1. Field of the Invention

The present invention relates to package structures, and, more particularly, to a package structure and a method for fabricating the package structure.

2. Description of Related Art

Along with the progress of semiconductor packaging technologies, various package types have been developed for semiconductor devices. To improve electrical performances and save spaces, a plurality of packages can be vertically stacked on one another to form a package on package (PoP) structure. Such a packaging method allows merging of heterogeneous technologies in a system-in-package (SiP) so as to systematically integrate a plurality of electronic components having different functions, such as a memory, a CPU (Central Processing Unit), a GPU (Graphics Processing Unit), an image application processor and so on, and therefore is applicable to various thin type electronic products.

Generally, to form a PoP structure, at least two packages are stacked on one another and electrically connected through a plurality of solder balls. However, as the packages tend to have smaller sizes and fine pitches, solder bridging easily occurs between the solder balls of the PoP structure, thus adversely affecting the product yield.

Accordingly, copper pillars are formed to achieve a stand-off effect so as to prevent solder bridging. FIGS. 1A and 1B are schematic cross-sectional views showing a method for fabricating a PoP structure 1 according to the prior art.

Referring to FIG. 1A, a first substrate 11 having a first surface 11a with a plurality of copper pillars 13 and a second surface 11b opposite to the first surface 11a is provided.

Referring to FIG. 1B, an electronic component 15 is disposed on the first surface 11a and electrically connected to the first substrate 11 in a flip-chip manner. Then, a second substrate 12 is stacked on the first substrate 11 through the copper pillars 13. In particular, the second substrate 12 is bonded to the copper pillars 13 of the first substrate 11 through a plurality of conductive elements 17. Each of the conductive elements 17 consists of a metal pillar 170 and a solder material 171 formed on the metal pillar 170. Subsequently, an encapsulant 16 is formed between the first surface 11a of the first substrate 11 and the second substrate 12.

However, since the copper pillars 13 are formed by electroplating, the size of the copper pillars 13 is difficult to control and the copper pillars 13 tend to have uneven heights. As such, a positional deviation easily occurs to the joints between the conductive elements 17 and the copper pillars 13 and hence a poor bonding easily occurs therebetween, thereby reducing the electrical performance and the product yield of the PoP structure 1.

Therefore, there is a need to provide a method for fabricating a package structure so as to overcome the above-described drawbacks.

SUMMARY OF THE INVENTION

In view of the above-described drawbacks, the present invention provides a method for fabricating a package structure, which comprises the steps of: providing a carrier having a plurality of bonding pads; laminating a laminate on the carrier, wherein the laminate has a built-up portion and a release portion smaller in size than the built-up portion, the release portion covering the bonding pads and the built-up portion being laminated on the release portion and the carrier; forming a plurality of conductive posts in the built-up portion; and removing the release portion and the built-up portion on the release portion such that a cavity is formed in the laminate to expose the bonding pads, the conductive posts being positioned around a periphery of the cavity.

In the above-described method, the carrier can be made of prepreg, polypropylene, glass fiber resin or polyimide.

In the above-described method, the release portion can have a first metal layer and a second metal layer stacked on one another, wherein the first metal layer is bonded to the bonding pads and the carrier. For example, the first metal layer and the second metal layer can be in physical contact with one another. The projection area of the second metal layer on the carrier can be less than the projection area of the first metal layer on the carrier.

In the above-described method, forming the conductive posts can comprise forming a plurality of through holes penetrating the built-up portion and filling a conductive material in the through holes to form the conductive posts.

In the above-described method, the built-up portion can have a circuit layer electrically connected to the conductive posts.

The above-described method can further comprise disposing a stack member on the built-up portion, wherein the stack member is electrically connected to the conductive posts. The stack member can be a packaging substrate, a semiconductor chip, a silicon interposer or a package.

In the above-described method, removing the release portion and the built-up portion on the release portion can comprise the steps of: laser cutting the built-up portion to remove a portion of the release portion and the built-up portion thereon; and removing the remaining portion of the release portion by etching.

The above-described method can further comprise disposing an electronic component in the cavity, wherein the electronic component is electrically connected to the bonding pads.

The present invention further provides a package structure, comprising: a carrier having a plurality of bonding pads; and a build-up portion disposed on the carrier and having an opening exposing from the carrier, wherein the build-up portion has a plurality of conductive posts that are disposed around opening.

Therefore, since the built-up portion is laminated on the carrier and the conductive posts are formed in the built-up portion, the present invention achieves a preferred stand-off effect so as to prevent bridging from occurring between the conductive posts.

Further, the size of the conductive posts can be controlled through the through holes of the built-up portion so as to cause the conductive posts to have a uniform height. Therefore, the present invention overcomes the conventional drawback of joint deviation and ensures a reliable bonding between the conductive posts and conductive elements to be formed subsequently, thereby improving the product yield.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2F are schematic cross-sectional views showing a method for fabricating a package structure according to the present invention.

Figure 1A:
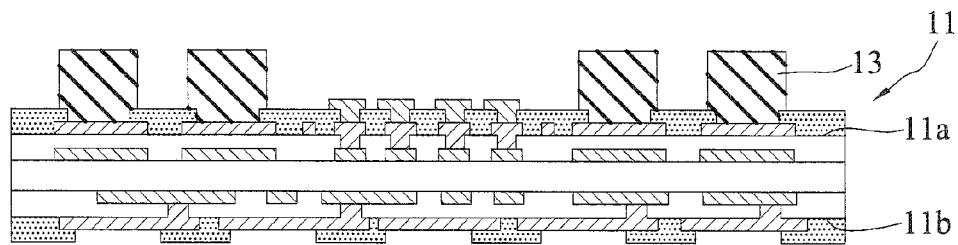
FIGS. 1A and 1B are schematic cross-sectional views showing a method for fabricating a PoP structure according to the prior art.
Figure 1B:
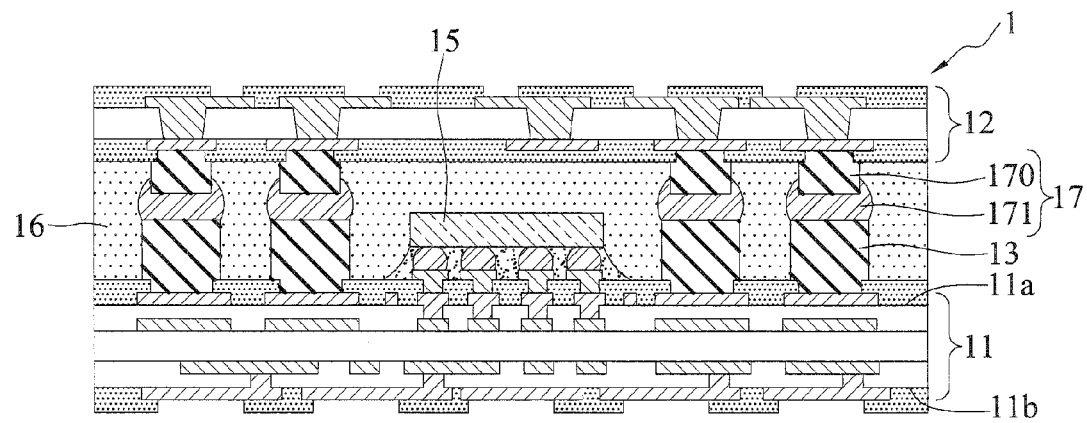
Figure 2A:
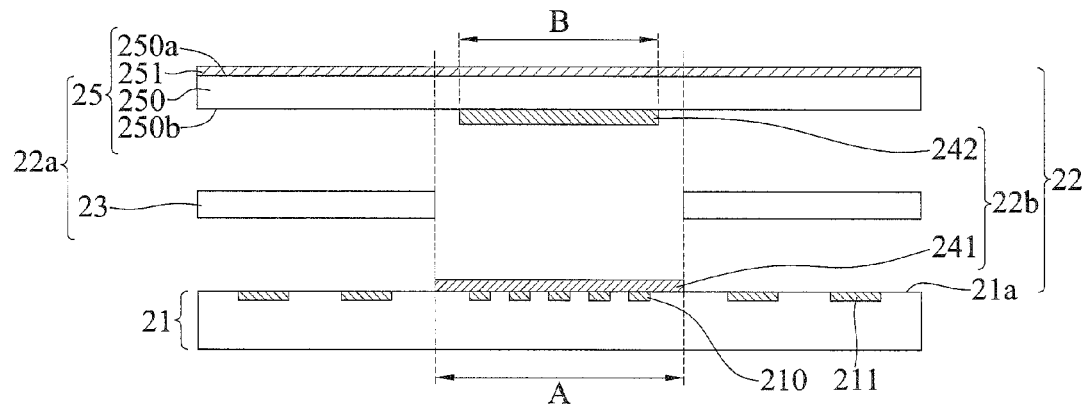
FIGS. 2A to 2G are schematic cross-sectional views showing a method for fabricating a package structure according to the present invention.

Referring to FIG. 2A, a carrier 21 and a laminate 22 are provided. The carrier 21 has a plurality of first bonding pads 210 and a plurality of second bonding pads 211.

In the present embodiment, the carrier 21 is made of prepreg, polypropylene, glass fiber resin or polyimide. A carrying area A is defined on the carrier 21, and the first bonding pads 210 are positioned inside the carrying area A and the second bonding pads 211 are positioned outside the carrying area A.

The laminate 22 has a built-up portion 22a and a release portion 22b.

The built-up portion 22a has a supporting plate 25 and a dielectric layer 23 having an opening corresponding to the carrying area A of the carrier 21. The supporting plate 25 has a base body 250 having a first surface 250a and a second surface 250b opposite to the first surface 250a and a conductor layer 251 formed on the first surface 250a of the base body 250. The dielectric layer 23 is made of prepreg (PP). The base body 250 is made of glass fiber-reinforced bismaleimide triazine (BT) resin. The conductor layer 251 is a copper layer.

The release portion 22b has a first metal layer 241 and a second metal layer 242 that are only in physical contact with one another. The first metal layer 241 and the second metal layer 242 can be, but not limited to, copper layers. The first metal layer 241 is bonded to the first bonding pads 210 and the surface 21a of the carrier 21, and the second metal layer 242 is bonded to the second surface 250b of the base body 250. Further, the projection area B of the second metal layer 242 on the carrier 21 is less than the projection area A of the first metal layer 241 on the carrier 21.

Figure 2B:
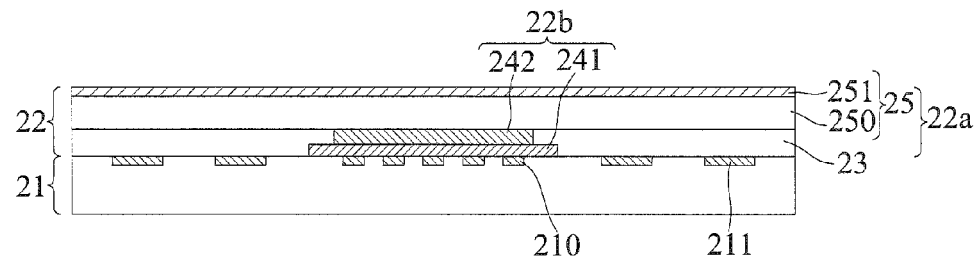

Referring to FIG. 2B, the laminate 22 is laminated on the surface 21a of the carrier 21, with the release portion 22b covering the first bonding pads 210 and the built-up portion 22a being laminated on the release portion 22b and the carrier 21.

In the present embodiment, the built-up portion 22a, the release portion 22b and the carrier 21 are thermally laminated together to simplify the fabrication process. Further, the first metal layer 241 facilitates to prevent overflow of the dielectric layer 23 during the lamination process.

Furthermore, the release portion 22b is secured at position by the dielectric layer 23 and the base body 250.

Figure 2C:
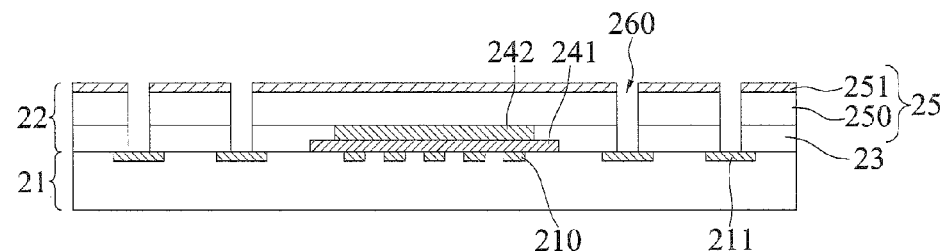

Referring to FIG. 2C, a plurality of through holes 260 are formed by laser drilling to penetrate the dielectric layer 23 and the base body 250 corresponding in position to the second bonding pads 211.

Figure 2D:
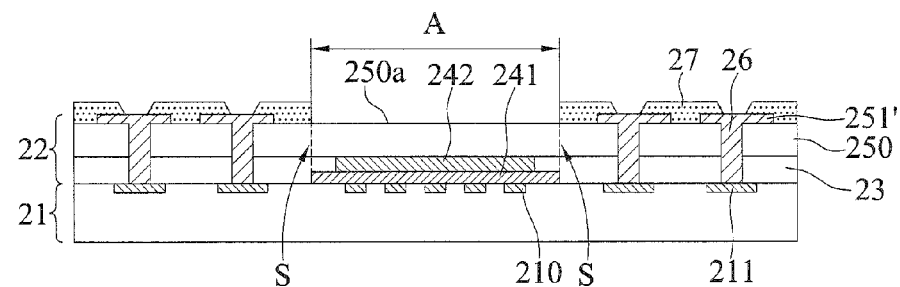

Referring to FIG. 2D, a circuit layer 251' is formed on the base body 250 through the conductor layer 251 and a conductive material is filled in the through holes 260 to form a plurality of conductive posts 26 electrically connecting the circuit layer 251' and the second bonding pads 211. Then, an insulating layer 27 is formed on the first surface 250a of the base body 250 and the circuit layer 251'. The circuit layer 251' is partially exposed from the insulating layer 27 for subsequently mounting external elements thereon.

In the present embodiment, either the circuit layer 251' or the insulating layer 27 is not formed on the first surface 250a of the base body 250 corresponding in position to the carrying area A.

Figure 2E:
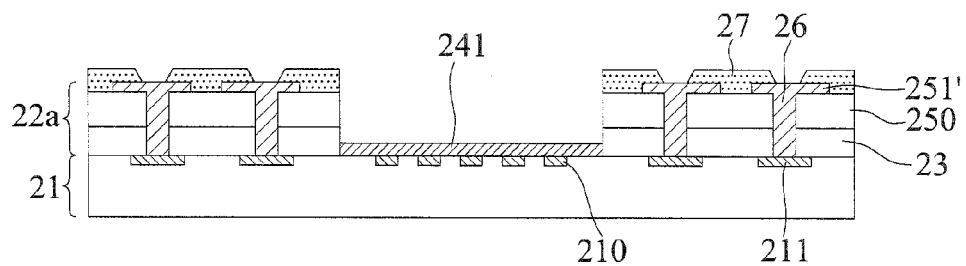

Referring to FIG. 2E, the base body 250, the second metal layer 242 and the dielectric layer 23 corresponding in position to the carrying area A are removed.

In the present embodiment, a laser cutting process is performed on the base body 250 and the dielectric layer 23 along a cutting path S corresponding to the carrying area A and having a cutting depth reaching the first metal layer 241. As such, when the base body 250 and the dielectric layer 23 are removed, since the first metal layer 241 and the second metal layer 242 are only in physical contact with one another, the second metal layer 242 can be removed along with the base body 250 and the dielectric layer 23.

Figure 2F:
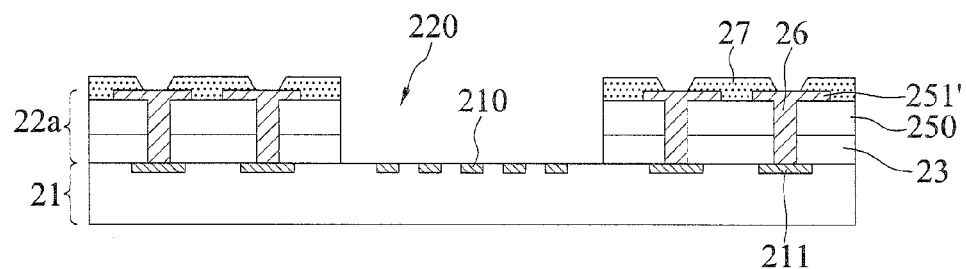

Referring to FIG. 2F, the first metal layer 241 is removed to form a cavity 220 in the laminate 22, thereby exposing a portion of the surface 21a of the carrier 21 in the carrying area A and the first bonding pads 210. The conductive posts 26 are positioned around a periphery of the cavity 220.

In the present embodiment, the first metal layer 241 is removed by etching.

Figure 2G:
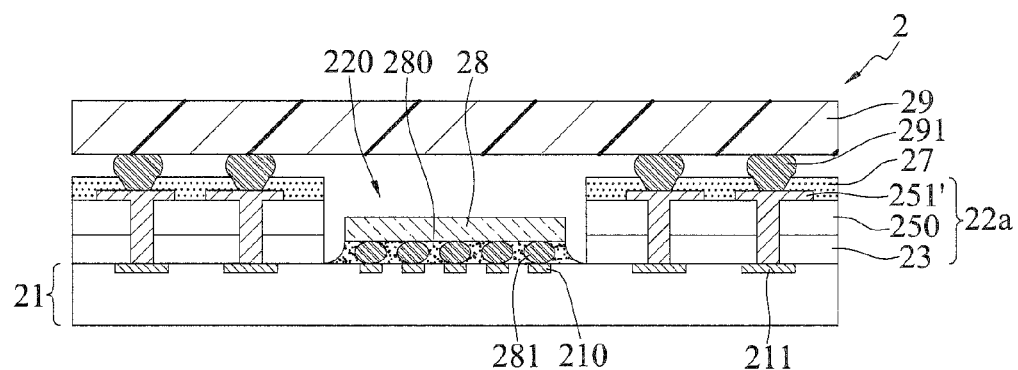

Referring to FIG. 2G, an electronic component 28 is disposed in the cavity 220 and electrically connected to the first bonding pads 210 through a plurality of conductive bumps 281. Further, an underfill 280 is formed between the electronic component 28 and the carrier 21 for encapsulating the conductive bumps 281. Then, a stack member 29 is stacked on the built-up portion 22a to cover the cavity 220 and the electronic component 28, thereby forming a package structure 2 of the present invention.

In the present embodiment, the stack member 29 is a packaging substrate, a semiconductor chip, a wafer, a silicon interposer or a package. The stack member 29 is electrically connected to the circuit layer 251' through a plurality of conductive elements 291 made of such as a solder material.

According to the present invention, the built-up portion 22a is laminated on the carrier 21 and the conductive posts 26 are embedded in the dielectric layer 23 and the supporting plate 25 of the built-up portion 22a, thereby achieving a preferred stand-off effect so as to prevent bridging from occurring between the conductive posts 26.

Further, the size of the conductive posts 26 can be controlled through the through holes 260 of the built-up portion 22a so as to cause the conductive posts 26 to have a uniform height. Therefore, the present invention overcomes the conventional drawback of joint deviation and ensures a reliable bonding between the conductive posts 26 and conductive elements 291, thus improving the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a package structure, comprising the steps of:

provided a carrier having a plurality of bonding pads;

laminating a laminate on the carrier, wherein the laminate has a built-up portion and a release portion smaller in size than the built-up portion, the release portion covering the bonding pads and the built-up portion being laminated on the release portion and the carrier, wherein the release portion has a first metal layer and a second metal layer stacked on and in physical contact with one another, the first metal layer is bonded to the bonding pads and the carrier, and a projection area of the second metal layer in a top view is less than a projection area of the first metal layer in the top view;

forming a plurality of conductive posts in the built-up portion; and removing the release portion and the built-up portion on the release portion such that a cavity is formed in the laminate to expose the bonding pads, the conductive posts being positioned around a periphery of the cavity.

2. The method of claim 1, wherein the carrier is made of prepreg, polypropylene, glass fiber resin or polyimide.

3. The method of claim 1, wherein forming the conductive posts comprises forming a plurality of through holes penetrating the built-up portion and filling a conductive material in the through holes to form the conductive posts.

4. The method of claim 1, wherein the built-up portion has a circuit layer electrically connected to the conductive posts.

5. The method of claim 1, further comprising disposing a stack member on the built-up portion, wherein the stack member is electrically connected to the conductive posts.

6. The method of claim 5, wherein the stack member is a packaging substrate, a semiconductor chip, a silicon interposer or a package.

7. The method of claim 1, wherein removing the release portion and the built-up portion on the release portion comprises the steps of:

laser cutting the built-up portion to remove a portion of the release portion and the built-up portion thereon; and removing the remaining portion of the release portion by etching.

8. The method of claim 1, further comprising disposing an electronic component in the cavity, wherein the electronic component is electrically connected to the bonding pads.

9. The method of claim 1, wherein the built-up portion further comprises:

a dielectric layer that is in contact with the carrier and has an opening;

a supporting plate formed on the dielectric layer.

* * * * *